United States Patent

Chiao et al.

[11] Patent Number: 5,889,829
[45] Date of Patent: Mar. 30, 1999

[54] PHASE LOCKED LOOP WITH IMPROVED LOCK TIME AND STABILITY

[75] Inventors: Jennifer Yuan Chiao, Chandler; Randy L. Yach, Phoenix, both of Ariz.

[73] Assignee: Microchip Technology Incorporated, Chandler, Ariz.

[21] Appl. No.: 779,907

[22] Filed: Jan. 7, 1997

[51] Int. Cl.⁶ ................................. H03D 3/24; H03L 7/00
[52] U.S. Cl. ............................ 375/376; 331/25; 327/156
[58] Field of Search ............................... 375/376; 331/25, 331/18, 17, 1 A, 1 R; 327/157, 156; 455/260

[56] References Cited

U.S. PATENT DOCUMENTS

| | | | |
|---|---|---|---|
| 4,270,093 | 5/1981 | Miille | 331/17 |
| 5,546,053 | 8/1996 | Ichimaru | 331/25 |
| 5,577,086 | 11/1996 | Fujimoto et al. | 375/376 |
| 5,656,975 | 8/1997 | Imura | 331/11 |
| 5,675,291 | 10/1997 | Sudjian | 331/17 |

*Primary Examiner*—Stephen Chin
*Assistant Examiner*—Betsy L. Deppe
*Attorney, Agent, or Firm*—Blank Rome Comisky & McCauley LLP

[57] ABSTRACT

A phase-locked loop (PLL) circuit is used to synchronize a local clock frequency with an edge of a reference clock frequency, employing a phase detector to compare the local clock frequency and the reference clock frequency to generate a control signal indicative of the need to increase or to decrease the local clock frequency for phase locking thereof to the reference clock frequency. A voltage controlled oscillator (VCO) is responsive to a signal voltage derived from the control signal to vary the local clock frequency as necessary to achieve phase locking. A loop filter has a reference voltage threshold level which is pre-programmable to enable the loop filter to respond to the control signal by adjusting the signal voltage as a virtual step function toward the programmed reference voltage threshold level before application to the VCO, and then cycling up and down in a search for a stable control signal voltage to reduce the time necessary to achieve the desired phase locking.

8 Claims, 3 Drawing Sheets

PHASE LOCKED LOOP WITH IMPROVED LOCK TIME AND STABILITY

BACKGROUND OF THE INVENTION

The present invention relates generally to phase locked loop circuits, and more particularly to improvements in starting up and stabilizing phase locked loops.

Phase locked loops (PLLs) are often used in integrated circuit (IC) devices to synthesize a fast (high frequency) clock based upon a slower clock. A suitable example of this need is in the presence of noise sensitive environments. Since most of the electrical noise of a system is generated by the off chip clock, it is advantageous to use a slower, low noise clock in the system and use a PLL to multiply the clock frequency inside the chip product.

In a classical implementation, a PLL circuit (FIG. 1) includes a phase detector 10 at the input side of the circuit to receive the reference clock signal and the local clock signal at inputs 11 and 12, respectively. The phase detector compares the phases of the two signals and supplies either an "up" signal or a "down" signal as a digital control signal to a charge pump 13, depending on whether the local clock signal is lagging or leading the reference clock signal, respectively. The charge pump 13 generates an analog version of the control signal at its output 14, which is fed through a low-pass loop filter 15 to remove or substantially reduce the higher frequency components and clock jitter otherwise attributable to oscillation of the local clock about the lock point. The output of the loop filter 15 is applied as an analog control input to a voltage-controlled oscillator (VCO) 17. If the control signal that derives from the phase detector 10 is up, the output frequency of VCO 17 is increased by an amount sufficient to bring the phase-lagging local clock signal into alignment (synchronization) with the edge of the reference clock signal. On the other hand, if the control signal is down, the VCO output frequency is commensurately decreased to bring the phase-leading local clock signal back into alignment with the edge of the reference clock signal.

The time interval consumed for the PLL to lock in phase alignment onto the reference signal or other input signal is referred to as the "lock time" (or sometimes, as the "start time" or "start-up") of the PLL. In general, a considerable lock time—delay—is typically experienced with PLL circuits heretofore available. Indeed, it is not unusual for the lock time to run 60 to 70 milliseconds (msec) or more. In the prior art PLL circuit of FIG. 1, where local clock is synchronized with the reference clock, for example, the presence of clock jitter can be a significant factor in increasing the lock time.

A primary objective of the present invention is to reduce the lock time interval of the PLL to a manageable level. This is particularly desirable where the PLL is used in a system or subsystem that performs a control function, such as in a microcontroller unit or device. The desire is to achieve a fast lock time, of the order of microseconds ($\mu$sec) rather than msecs. Existing semiconductor PLL chips generally exhibit a lock time which is so slow that chip start-up requires holding the chip in reset throughout the lock time interval.

One prior art technique which as been advanced as a possible solution to the problem of substantial lock time is to use a lock detect bit, which effectively instructs that nothing is to be done until the detect bit goes active. But among other problems that arise from this technique is the inability to detect a proper lock, so this has not provided an adequate solution.

SUMMARY OF THE INVENTION

According to the invention, the PLL system utilizes a loop filter which has a preset reference voltage to bias the filter toward an immediate pump up requirement to a level which may even slightly overshoot the reference voltage level as a threshold. The loop filter is followed by a voltage controlled oscillator (VCO) which, aside from some circuit characteristic restrictions, is conventional.

When the PLL is on, the circuit commences from a zero voltage, essentially ground level in the usual manner, but because the reference node used in the circuit is not maintained at ground level, but rather at the predetermined reference voltage threshold, the pump up takes place at a steep ramp toward the threshold level. The reference is tantamount to a dynamic ground which assures that the PLL will move toward a rapid lock, oscillating upwardly from the threshold level to a point of stabilization at the equalization voltage and frequency. The result with an implementation of a PLL according to the present invention is achievement of a lock time on the order of microseconds versus the heretofore typical lock time which runs some three orders of magnitude greater.

The task is made more difficult where additional restrictions are imposed as a result of the environment in which the PLL is used. By virtue of its use in a microcontroller unit, for example, the PLL was limited to a relatively low current, the ability to accept a variable input frequency over relatively wide range, and the need for a 50% duty cycle. The variable clock input frequency, however, is not dynamic during a particular application, i.e., a single frequency is used for each application, and the PLL has the ability to multiply any given input frequency up as required. Also, the duty cycle requirement tends to eliminate the possible use of a clock multiplier rather than a PLL. In addition, the solution had to be achieved with due attention to limited silicon consumption, i.e., that the PLL should have the capability to perform its function while occupying a very small IC die area.

The VCO requirements in this context include a design suitable for the voltage range of interest, but that falls into the category of a relatively typical design consideration, unlike those which needed to be considered for the loop filter design.

BRIEF DESCRIPTION OF THE DRAWINGS

The above and still further aims, objects, aspects, features and attendant advantages of the present invention will become apparent from a consideration of the following detailed description of the best mode currently contemplated for practicing the invention, encompassed by certain preferred methods and embodiments, taken in conjunction with the accompanying drawings, in which.

DETAILED DESCRIPTION OF THE PREFERRED METHODS AND EMBODIMENTS

In essence, the invention provides a method of synchronizing a local clock frequency with an edge of a reference clock frequency using a phase-locked loop, which includes steps of applying the local clock frequency and the reference clock frequency to a phase comparator of the PLL to generate a control signal indicative of the need to pump up or to pump down the local clock frequency for phase locking thereof to the reference clock frequency, applying a signal voltage derived from the control signal to a voltage controlled oscillator (VCO) of the PLL to vary the local clock frequency as necessary for the phase locking, and adjusting the signal voltage before application to the VCO by delivering the control signal to a loop filter of the PLL to bias the control signal toward a preset reference voltage threshold level selected to reduce the time necessary to achieve the desired phase locking.

According to an aspect of the method, the preset reference voltage threshold level is applied to a node within the loop filter which will produce a rapid ramping, virtual step up of the control signal, and thereby, of the signal voltage to be applied to the VCO.

In a similar manner, PLL apparatus of the invention enables rapid synchronization of a local clock frequency with an edge of a reference clock frequency. The PLL includes a phase detector for comparing the local clock frequency and the reference clock frequency to generate a control signal indicative of the need to increase or to decrease the local clock frequency for phase locking thereof to the reference clock frequency, a VCO responsive to a signal voltage derived from the control signal for varying the local clock frequency as necessary for phase locking, and a loop filter having a preset reference voltage threshold level and responsive to the control signal for adjusting the signal voltage toward the preset reference voltage threshold level before application to the VCO to reduce the time necessary to achieve the desired phase locking.

In the PLL apparatus, the preset reference voltage threshold level is provided at a node within the loop filter to cause a rapid ramping up of the control signal, and thereby, of the signal voltage to be applied to the VCO.

Figure 1:
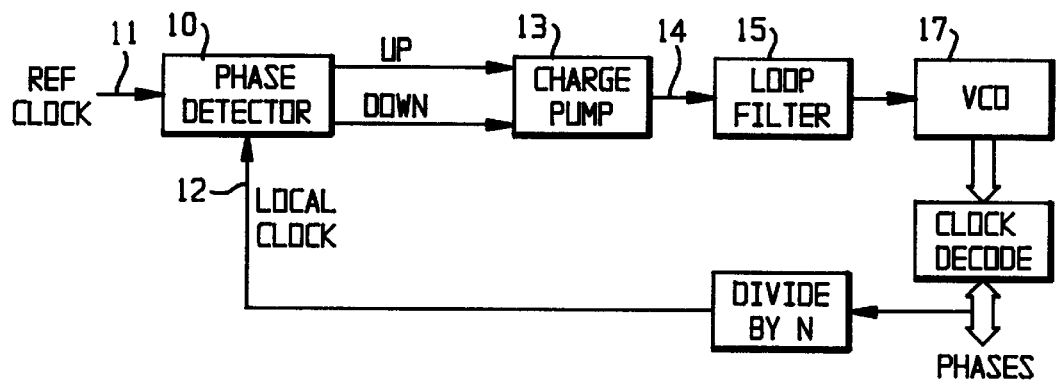
FIG. 1 is a block diagram of a classic implementation of a PLL system, described in the above background section.
Figure 2:
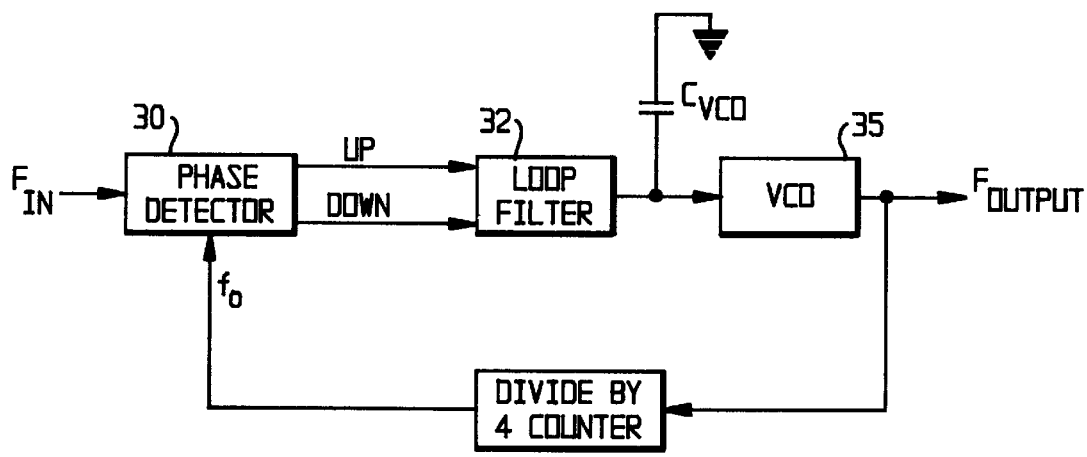
FIG. 2 is a block diagram of a simplified implementation of the PLL of the present invention.

Referring now to FIG. 2, the PLL circuit of the invention as shown in block diagrammatic form utilizes a generally classical implementation much like that of FIG. 1. A reference clock frequency $F_{in}$ and a local clock frequency $F_o$ which is to be generated in synchronization with the former are applied as inputs to a phase comparator 30. The "up" or "down" signal developed by the comparator, depending on whether the local frequency is lagging or leading the reference frequency, is applied to loop filter 32. As will be discussed presently in greater detail with reference to FIG. 3, the loop filter is implemented in a way which utilizes a dynamic reference voltage that can be programmed as a starting point for achieving a phase lock between the signals under comparison, in a time interval which is significantly less than that required by prior art implementations but without sacrificing stability. The reference voltage is provided at a selected node of the loop filter to assure that although the lock-on commences at zero, that level is quickly discarded as the control voltage for application to VCO 35 is quickly pumped up to a level exceeding the threshold level set by the reference voltage. The arrangement is such that the circuit is only allowed to be pumped up at start-up, and not pumped down initially. Only when the voltage level rises to a point which overshoots the reference threshold level can it be pumped down.

It should be noted that pumping up the circuit is preferable to pumping down, at least for purposes of quickly establishing the lock and the stabilization and equalization the occurs with the lock-up. This is in contradistinction to the prior art in which the node in question is either pulled up or pulled down, with a resistor at that location and a capacitor to provide an RC time constant that effects a delay which slows down the procedure. That control voltage for the VCO in the prior art implementations must then be increased slowly from its starting point of zero volts, and must be decreased just as slowly, in an iterative process in the search for a lock. Eventually, after many cycles, this would produce a lock, but the process is quite slow.

In contrast, the present invention employs a dynamic ground, such that for start up of the chip, the voltage rises at a rapid rate to a point beyond the threshold, and then the "ground" reference is set. The effect is that the loop filter mandates a very rapid ramp up, followed by a fast cycling between relatively small increment alternations of pumping down and pumping up to arrive at a final VCO control voltage quickly. In this way, locking and stabilization are achieved within a time interval of a few $\mu$secs.

Figure 3:
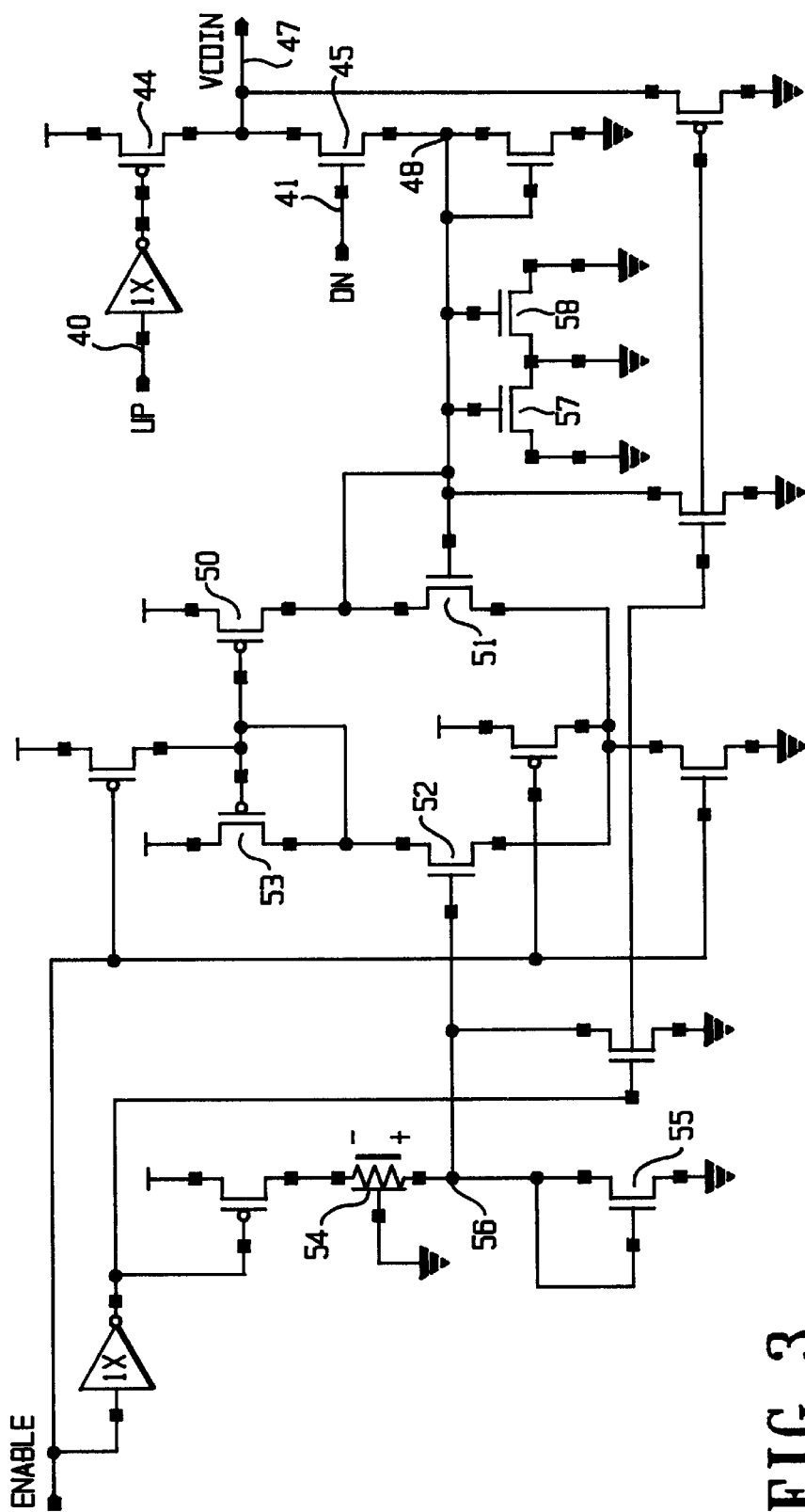
FIG. 3 is a schematic circuit diagram of a preferred embodiment of the loop filter of the present invention.

Referring now to FIG. 3, the "up" and "down" signals at inputs 40 and 41, respectively, alternately derived from the phase comparator, are applied to the loop filter at the gates of a pair of transistors 44 and 45. The VCO control voltage $VCO_{in}$ is taken off at an output 47 between the series connected source-drain paths of these transistors, which themselves are connected between the chip supply voltage and a node 48. According to the invention, node 48 is tied not to static ground, but to a preselected reference voltage which constitutes a desired threshold level as the initial target for a forced, rapid pump up of $VCO_{in}$. The reference voltage at node 48 is programmable to allow it to be set at a desired threshold level for the input frequencies to the overall PLL circuit which are under comparison, in effect constituting a dynamic ground reference.

To that end, the circuit of FIG. 3 includes an operational amplifier comprising devices 50, 51, 52, and 53, which forces node 48 to be at the same voltage as a node 56. Devices 54 and 55 at either side of node 56 are adjustable to enable preselection of a reference voltage on node 56. That reference voltage is then mirrored to node 48 through the operational amplifier. The reference voltage is preselected to set a desired initial target voltage for the VCO to quickly ramp up, and, in the process, to significantly reduce the overall lock-time of the PLL.

Node 56 is not tied directly to node 48 because of the requirement of a current sink which could introduce noise into the reference circuit if the two nodes were directly connected. Devices 57 and 58 constitute a capacitor which serves to stabilize node 48 and to decrease the jitter of the PLL system.

Figure 4:
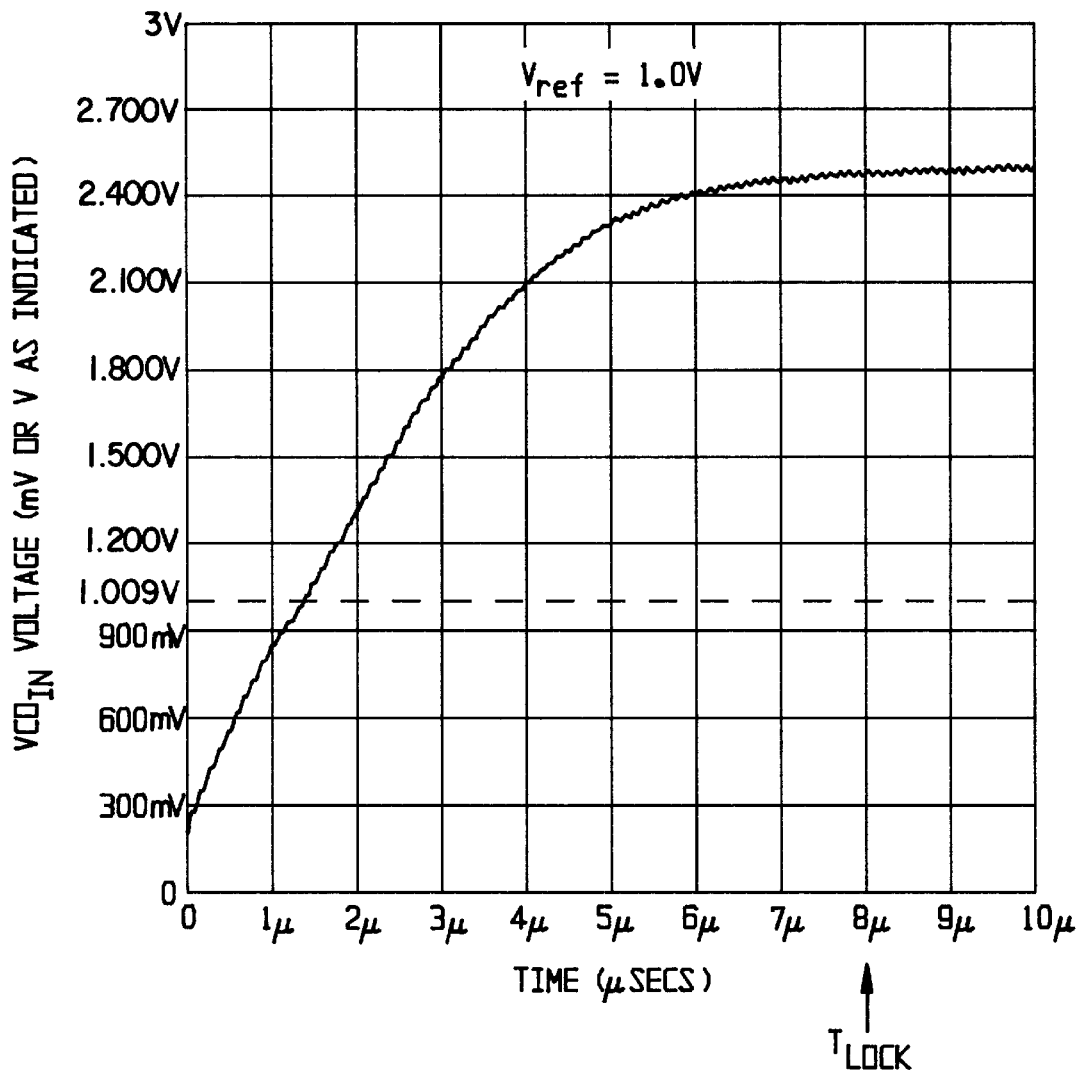
FIG. 4 is a plot of loop filter output (and $VCO_{in}$) voltage versus time illustrating the lock time achievable in a PLL using a loop filter of the type of FIG. 3.

In the plot of $VCO_{in}$ voltage versus time shown in FIG. 4, the reference voltage at node 48 of the loop filter circuit of FIG. 3 is programmably set (for illustrative purposes only) at about 1.0 volt. The reason for setting what may appear to be a somewhat low voltage level is twofold. First, if the reference voltage were preselected at too high a level the tendency would be for the PLL to overshoot the reference voltage by a possibly substantial margin. Then, some time would elapse while the PLL adjusted back to the reference threshold because the loop filter is designed to favor pump-up over pump-down. Accordingly, it is preferable that the PLL start with an undershoot of the reference voltage level. Second, the reference voltage is set, in the case of the illustrative plot of FIG. 4, for a particular exemplary frequency. In practice, it is necessary that the starting voltage be in the range of the entire spectrum of operation of the circuit. Hence, the reference voltage level generally will be preselected with some knowledge or anticipation of the frequency of the reference clock.

The sequence of pumping variations shown in FIG. 4 is illustrative of an "up/down" characteristic, but in practice that characteristic is more properly an "up/stay" until the PLL achieves a lock. The up/down signals are actually pulses with duration proportional to the amount of time the reference clock is ahead/behind the output $F_o$.

It should be noted that the plot of FIG. 4 is based on a typical simulation range. In practice, given shifts occurring with temperature and process variations, the lock time ($T_{lock}$) which occurs at approximately 8 µsecs in the illustrative simulation of the Figure, will occur in a range of the order of 100 µsecs.

It will thus be seen that by preselecting the voltage level of a reference node of the PLL circuit to be maintained at a value different from ground level, and indeed at a threshold value which is based on the frequency of the input reference clock so that it constitutes a "dynamic ground," then, when the PLL commences it start-up, it moves in almost a step function not from a zero voltage, but rather at a steep ramping up toward the threshold level. The result is that the PLL achieves a lock in a time interval which is much shorter than what had heretofore been achievable. And this advantage is accomplished without the penalty of substantially increased processing costs or silicon real estate costs.

Although a best mode currently contemplated for practicing the invention has been described herein, in conjunction with certain preferred methods and embodiments, it will be recognized by those skilled in the art of the invention that variations and modifications of the disclosed methods and embodiments may be made without departing from the true spirit and scope of the invention. Accordingly, it is intended that the invention shall be limited only by the appended claims and the rules and principles of the applicable law.

What is claimed is:

1. A method of synchronizing a local clock frequency with an edge of a reference clock frequency using a phase-locked loop (PLL), which comprises the steps of applying the local clock frequency and the reference clock frequency to a phase comparator of the PLL to generate a control signal indicative of the need to pump up or to pump down the local clock frequency for phase locking thereof to the reference clock frequency, applying a signal voltage derived from the control signal to a voltage controlled oscillator (VCO) of the PLL to vary the local clock frequency as necessary for said phase locking, and adjusting the signal voltage before application to the VCO by delivering the control signal to a loop filter of the PLL to bias the control signal toward a preset reference voltage threshold level selected to reduce the time necessary to achieve the desired phase locking.

2. The method of claim 1, wherein the preset reference voltage threshold level is applied to a node within the loop filter to expedite ramping up of the control signal, and thereby, of the signal voltage to be applied to the VCO.

3. The method of claim 1, wherein the preset reference voltage threshold level is preprogrammed.

4. Phase-locked loop (PLL) apparatus for synchronizing a local clock frequency with an edge of a reference clock frequency, comprising a phase detector of the PLL for comparing the local clock frequency and the reference clock frequency to generate a control signal indicative of the need to increase or to decrease the local clock frequency for phase locking thereof to the reference clock frequency, a voltage controlled oscillator (VCO) responsive to a signal voltage derived from the control signal for varying the local clock frequency as necessary for said phase locking, and a loop filter having a preset reference voltage threshold level and responsive to the control signal for adjusting said signal voltage toward said preset reference voltage threshold level before application to the VCO to reduce the time necessary to achieve the desired phase locking.

5. The PLL apparatus of claim 4, wherein the preset reference voltage threshold level is provided at a node within the loop filter to expedite ramping up of the control signal, and thereby, of the signal voltage to be applied to the VCO.

6. The PLL apparatus of claim 5, wherein the preset reference voltage threshold level is preprogrammed.

7. In a microcontroller unit on an integrated circuit chip, a locked loop circuit for rapidly locking a local signal having an input frequency in synchronism with a reference signal of fixed frequency and stabilizing the local signal frequency with the reference signal fixed frequency, the locked loop circuit including a comparator for detecting the displacement between the local signal frequency and the reference signal frequency and for developing an output signal specifying an increase or a decrease in the local signal frequency for synchronization with the reference signal frequency, a voltage controlled oscillator (VCO) for adjusting the frequency of the local signal depending on the level of a control voltage applied to the VCO, and a loop filter for deriving a control voltage for the VCO from the comparator output signal and for initiating a ramping up of the control voltage approaching a step change thereof to an outset level closer to that required to achieve said locking than the level otherwise dictated by the comparator output signal.

8. The locked loop circuit of claim 7, wherein said loop filter includes a dynamic reference node having a programmable voltage level set to produce said ramping up of the control voltage approaching a step change.

\* \* \* \* \*